United States Patent
Gronenborn

(10) Patent No.: US 9,478,941 B2
(45) Date of Patent: Oct. 25, 2016

(54) OPTICALLY PUMPED SOLID STATE LASER DEVICE WITH SELF-ALIGNING PUMP OPTICS

(71) Applicant: KONINKLIJKE PHILIPS N.V., Eindhoven (NL)

(72) Inventor: Stephan Gronenborn, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 0 days.

(21) Appl. No.: 14/395,847

(22) PCT Filed: Nov. 15, 2012

(86) PCT No.: PCT/IB2012/056435
§ 371 (c)(1),
(2) Date: Oct. 21, 2014

(87) PCT Pub. No.: WO2013/160738
PCT Pub. Date: Oct. 31, 2013

(65) Prior Publication Data
US 2015/0110146 A1    Apr. 23, 2015

Related U.S. Application Data

(60) Provisional application No. 61/638,537, filed on Apr. 26, 2012.

(51) Int. Cl.
*H01S 3/08* (2006.01)
*H01S 5/04* (2006.01)
*H01S 3/0941* (2006.01)
(Continued)

(52) U.S. Cl.
CPC ............ *H01S 5/041* (2013.01); *H01S 3/025* (2013.01); *H01S 3/042* (2013.01); *H01S 3/08068* (2013.01); *H01S 3/09415* (2013.01); *H01S 3/0405* (2013.01); *H01S 3/061* (2013.01); *H01S 3/09408* (2013.01); *H01S 5/0071* (2013.01); *H01S 5/02248* (2013.01); *H01S 5/02438* (2013.01); *H01S 5/4025* (2013.01)

(58) Field of Classification Search
CPC .............. H01S 5/041; H01S 3/09415; H01S 3/094038; H01S 3/09408; H01S 3/0405; H01S 5/02438; H01S 3/042; H01S 3/025; H01S 3/08059–3/08068; H01S 5/0071
See application file for complete search history.

(56) References Cited

U.S. PATENT DOCUMENTS 4,785,462 A * 11/1988 Keil ................................ 372/92
5,077,750 A * 12/1991 Pocholle et al. ................ 372/68
(Continued)

FOREIGN PATENT DOCUMENTS

DE    19728845 A1 *  1/1999 ............. H01S 3/093
DE    19927054 A1    12/2000
(Continued)

*Primary Examiner* — Joshua King

(57) ABSTRACT

The present invention relates to an optically pumped solid state laser device, comprising a solid state laser medium (300-302) in a laser resonator. Several pump laser diodes (100) are arranged to optically pump said solid state laser medium (300-302) by reflection of pump radiation at a mirror element (200) arranged on the optical axis of the laser resonator. The mirror element (200) is designed to direct said pump radiation to the solid state laser medium (300-302) and to form at the same time one of the resonator mirrors of the laser resonator. With this design of the solid state laser device an easy alignment of the pump optics is achieved. The proposed solid state laser device can be realized in a compact form.

12 Claims, 7 Drawing Sheets

(51) Int. Cl.
*H01S 3/02* (2006.01)
*H01S 3/042* (2006.01)
*H01S 3/094* (2006.01)
*H01S 5/022* (2006.01)
*H01S 5/024* (2006.01)
*H01S 5/40* (2006.01)
*H01S 3/04* (2006.01)
*H01S 3/06* (2006.01)
*H01S 5/00* (2006.01)

(56) References Cited

U.S. PATENT DOCUMENTS

| | | |
|---|---|---|
| 5,084,974 A | 2/1992 | Sukow |
| 6,351,477 B1 | 2/2002 | Du |
| 6,577,666 B2 * | 6/2003 | Erhard et al. ............... 372/70 |
| 7,430,231 B2 | 9/2008 | Luo |
| 7,751,457 B2 * | 7/2010 | Suzudo et al. ............ 372/50.1 |
| 2002/0075934 A1 | 6/2002 | Ludewigt |
| 2003/0147255 A1 * | 8/2003 | Im ............................ 362/558 |
| 2006/0140241 A1 * | 6/2006 | Schmitz et al. ............. 372/92 |
| 2007/0002922 A1 * | 1/2007 | McDonald .................. 372/92 |
| 2009/0034575 A1 * | 2/2009 | Wang et al. ................. 372/70 |
| 2010/0014547 A1 * | 1/2010 | Cabaret ....................... 372/34 |
| 2012/0250719 A1 * | 10/2012 | Hodgson et al. ........... 372/70 |

FOREIGN PATENT DOCUMENTS

| | | | |
|---|---|---|---|
| JP | 2185082 | 7/1990 | |
| JP | 2006108134 | 4/2006 | |
| JP | 2006165292 A * | 6/2006 | ............ H01S 3/094 |

* cited by examiner

OPTICALLY PUMPED SOLID STATE LASER DEVICE WITH SELF-ALIGNING PUMP OPTICS

CROSS-REFERENCE TO PRIOR APPLICATIONS

This application is the U.S. National Phase application under 35 U.S.C. §371 of International Application No. PCT/IB2012/056435, filed on Nov. 15, 2013, which claims the benefit of U.S. Patent Application No. 61/638,537, filed on Apr. 26, 2012. These applications are hereby incorporated by reference herein.

FIELD OF THE INVENTION

The present invention relates to an optically pumped solid state laser device comprising a solid state laser medium arranged in a laser resonator and one or several pump laser diodes, said pump laser diodes being arranged to optically pump said solid state laser medium by reflection of pump radiation at a mirror element. Diode-pumped solid state lasers are among the most used laser sources for a huge number of applications requiring higher brightness and/or shorter pulses than can be delivered by laser diodes. The present invention is not limited to such an application but can be used in any application which requires an appropriate solid state laser.

BACKGROUND OF THE INVENTION

A device for longitudinal pumping of a laser medium is disclosed in US 2010/0014547 A1. This device comprises several pump laser diodes which are mounted on side faces of a cooling device of the laser medium. The pump radiation emitted by said laser diodes is reflected by several parabolic mirrors toward one of the end faces of the solid state laser medium. A problem of end-pumped solid state lasers is the requirement to precisely align the pump lasers and the pump laser optic with respect to the optical mode of the laser resonator. This problem also arises in the device of US 2010/0014547 A1, in which each of the parabolic mirrors has to be precisely aligned in order to achieve the desired intensity distribution of the pump radiation at the entrance of the solid state laser medium.

SUMMARY OF THE INVENTION

It is an object of the present invention to provide an optically pumped solid state laser device which enables an easier alignment of the pump optics and can be realized in a compact manner.

The object is achieved with the optically pumped solid state laser device according to claim 1. Advantageous embodiments of the device are subject matter of the dependent claims or can be deduced from the subsequent portions of the description and preferred embodiments.

The proposed optically pumped solid state laser device comprises a solid state laser medium arranged in a laser resonator and one or several pump laser diodes to optically pump the solid state laser medium. The pump laser diodes are arranged to pump said solid state laser medium, preferably through an end face of the solid state laser medium, by reflection of pump radiation at a mirror element. The mirror element is arranged on the optical axis of the laser resonator and is designed on the one hand to reflect the pump radiation to the solid state laser medium, preferably to the end face of the solid state laser medium, and on the other hand to form one of the resonator end mirrors of the laser resonator. This mirror element thus incorporates two functions in one single element. The other end mirror of the laser resonator may be a separate mirror or may be formed as a coating of the opposing end face of the solid state laser medium. The laser resonator may be an unstable resonator.

The solid state laser device of the present invention uses an appropriately designed mirror element which directs the pump light into the solid state laser medium and acts as the laser resonator mirror at the same time. Thus, the pump beam and the laser mode always overlap perfectly without complicated alignment since the part of the mirror element forming the pump optics is always in a fixed spatial relationship to the part of the mirror element forming the resonator end mirror. With such a self-centering mirror element the alignment of the pump optics is significantly simplified. The proposed design allows the arrangement of the pump laser diodes to direct the pump radiation substantially parallel to the optical axis towards the mirror element. Such an arrangement results in a very compact design of the solid state laser device.

The mirror element preferably comprises a central region which forms the resonator mirror and an outer region which is designed to reflect the pump radiation to the end face of the solid state laser medium. To this end the mirror element is preferably manufactured as a free-form optics allowing nearly any shape of the reflecting mirror surfaces in the central and outer regions of the mirror element. The outer region which preferably completely surrounds the central region may be designed to generate e.g. a flat-top intensity distribution of the pump radiation at the end face of the solid state laser medium which matches the cross sectional shape of the end face or which matches in size and/or shape the desired optical mode of the laser.

The solid state laser medium may be formed as a rod, a fiber, a disc or a slab or may have any other shape appropriate for use in a solid state laser. The pump laser diodes may be single diodes or arrays of laser diodes, for example VCSEL arrays (VCSEL: vertical cavity surface emitting laser) or microchip-VECSEL arrays (VECSEL: vertical external cavity surface emitting laser). The body of the mirror element may be formed of any appropriate material, for example of a metal, a coated glass or coated plastics. In case of a metal body, the reflecting surfaces of the mirror element may be formed of this metal, e.g. of polished aluminium. In case of a glass or plastic body, the mirror surface is formed by an appropriate metallic or dielectric coating as known in the art.

The mirror element preferably comprises a body of a material which is optically transparent for the laser and pump radiation. This allows both the front surface of the body facing the solid state laser medium and the back surface of the body to form optical surfaces and thus allows more flexibility in the design of the resonator. The central portion of the front surface preferably forms a lens and the central portion of the back surface forms the resonator mirror. At the same time, the outer portion of the front or the back surface forms the mirror to focus the pump radiation in the solid state laser medium.

This design of the optical element enables larger mode sizes and therefore higher laser powers even for small resonator dimensions. Without such a lens formed in the front surface of the body, the maximum power due to a small mode volume inside the solid state laser medium is limited. For disc lasers this small mode volume is mainly given by the beam waist of the mode in the laser medium. The maximum beam waist is achieved in a semiconfocal resonator and is given by the square root of the wavelength times the resonator length L divided by π. For a compact system with a length in the order of 10-20 mm the mode size without the above lens is limited to approx. 50 µm. With the combination of the lens and the resonator mirror in the body of the optical element, a significantly larger mode size in the laser medium and thus larger laser power can be achieved.

The arrangement of the mirror for reflecting the pump radiation towards the solid state laser medium at the back surface of the body also allows to realize an additional beam deflecting or beam forming function for the pump radiation by appropriately designing or shaping the front surface.

The solid state laser medium may be mounted in a cooling device or attached to such a cooling device. In an advantageous embodiment of the laser device the pump laser diodes are arranged on a side face of said cooling device facing said mirror element. This allows a very compact design of the solid state laser device. Preferably the pump laser diodes are distributed around the end face of the solid state laser medium. The pump lasers may be mounted directly to the side face of the cooling device and thus benefit from the cooling function of this cooling device. The cooling device may be a heat sink of a bulk material, in particular a metal, and may also have cooling fins for air cooling. It is also possible to realise this cooling device as a chamber for a cooling liquid, for example water, which is pumped through the cooling device during operation of the laser.

In addition, other semiconductor elements may be added next to the pump lasers, e.g. temperature sensors or photodiodes to detect the power of the pump radiation or the power of the solid-state laser emission. Even parts of the electrical driver of the pump diodes may be added.

In a further embodiment of the proposed solid state laser device the mirror element is formed to mechanically fit on the outer sides of the cooling device. The outer shape of a front portion of the mirror element is designed such that by mounting or fitting the mirror element to the cooling device an automatic alignment with the optical axis of the solid state laser medium is achieved. By an appropriate design and mechanical fixation of the mirror element to the cooling device the mirror surface and the end face of the solid state laser medium are automatically sealed against the surrounding.

These and other aspects of the invention will be apparent from end elucidated with reference to the embodiments described during after.

BRIEF DESCRIPTION OF THE DRAWINGS

The proposed solid state laser device is described in the following by way of examples in connection with the accompanying drawings in further detail. The figures show.

DETAILED DESCRIPTION OF EMBODIMENTS

Figure 1:
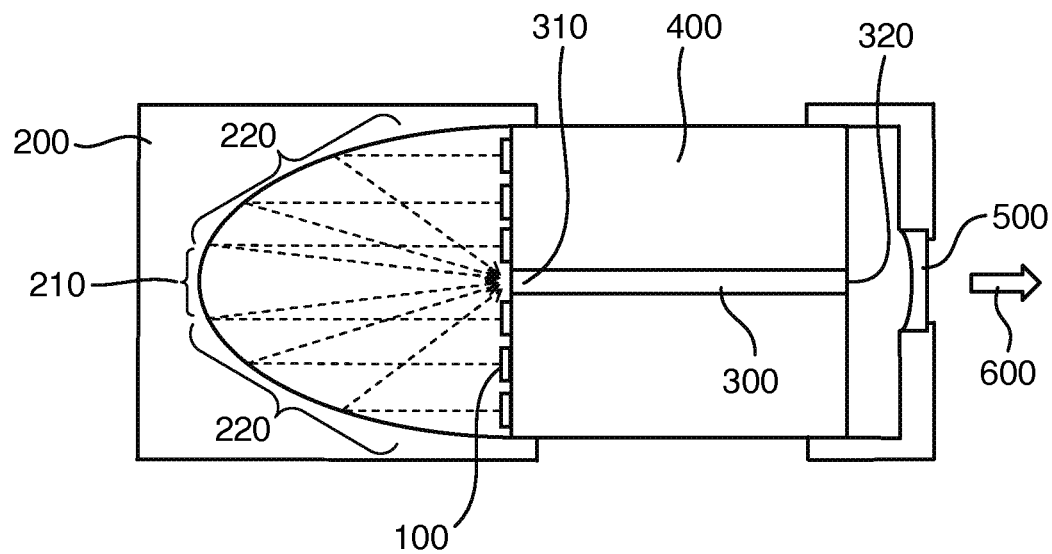
FIG. 1 a first example of the proposed solid state laser device.

FIG. 1 shows a side view of a first example of the proposed solid state laser device. A solid state laser rod 300 is integrated in the center of a heat sink 400. On one side of the heat sink 400, the pump diode lasers 100, for example VCSEL arrays, are integrated. A mirror element 200 fits on the outer sides of the heat sink 400 and is thus aligned with the optical axis of the laser rod 300. This mirror element 200 forms one of the resonator end mirrors in a central portion 210 of the mirror element. The outer region 220 of the mirror element 200 is formed as a parabolic mirror which reflects the pump radiation emitted by the pump laser diodes 100 towards the end face of the laser rod 300. This is schematically indicated in the figure. The second end mirror 500 of the laser resonator in this example is mounted on the other side of the laser rod 300 in a similar self-centered manner by fitting a mounting of this mirror to the outer sides of the heat sink 400. With such a mounting and corresponding outer shape of the body of mirror element 200 the mirror surfaces and the surfaces of the laser rod 300 can be easily sealed against the surrounding. The faces of the laser rod 300 are coated with antireflective (AR) coatings. End face 310 facing the mirror element 200 can be AR-coated (R<2%, preferably R<0.2%) at the pump wavelength and at the laser wavelength. The opposite face 320 is HR (high reflective)-coated for the pump wavelength and AR-coated for the wavelength of the solid state laser.

Figure 2:
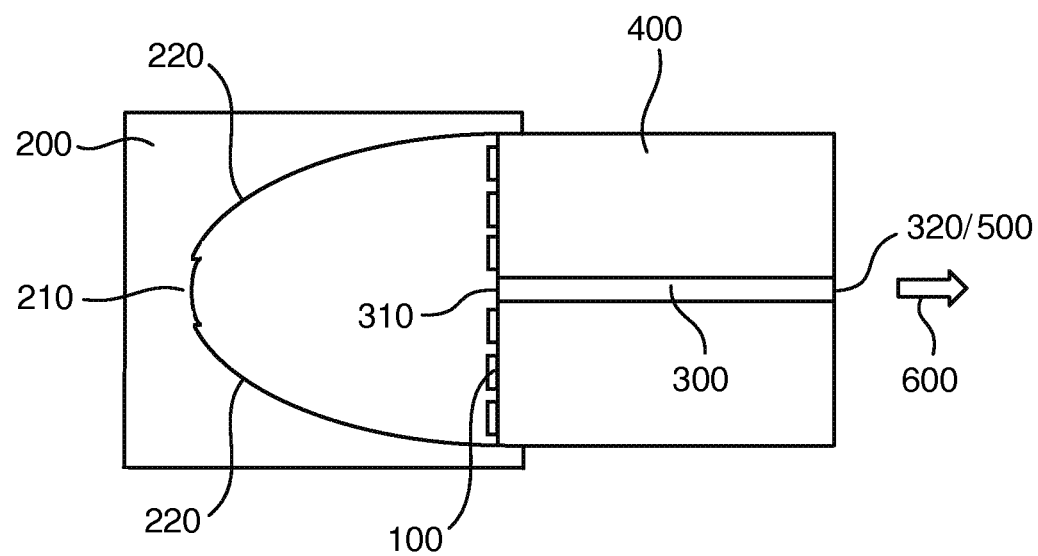
FIG. 2 a second example of the proposed solid state laser device.

FIG. 2 shows a further embodiment of the proposed solid state laser in which a free-form mirror is used as the mirror element 200 covering the two functions of directing and shaping the pump light to the end face 310 of laser rod 300 and forming a resonator end mirror of the laser resonator. The shape of the outer region 220 of the mirror element 200 may have an advanced design tailoring the intensity distribution of the pump lasers 100 in a special manner. The central region 210 acts as a spherical mirror for the solid state laser and shapes the resonator mode. This central region 210 can also have a special free-form to shape the resonator mode to e. g. a top-hat mode. The combination of resonator end mirror and pump optics in a single mirror element ensures a perfect overlap of the pump spot with the resonator mode. The surface of the end face 310 of the laser rod 300 has to be AR-coated for both wavelengths, the pump wavelength and the laser wavelength, while the opposing surface 320 forms the second resonator end mirror. This end face is HR-coated for the pump light and has the desired outcoupling reflectivity for the solid state laser wavelength. Laser emission 600 of the solid state laser is indicated in the all of the figures.

Figure 3:
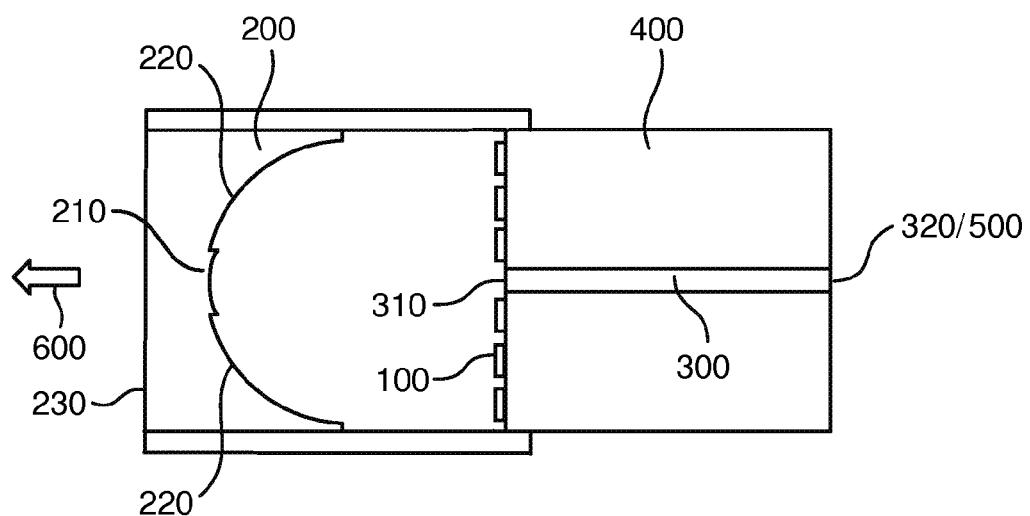
FIG. 3 a third example of the proposed solid state laser device.

In a further embodiment shown in FIG. 3, the free from-mirror is made of glass and serves as the outcoupling mirror for the solid state laser in the center region 210, while the surface of the outer region 220 focuses the pump light into the laser rod 300. The end face 310 of the laser rod 300 needs to be AR-coated for both wavelengths, while the opposing surface 320 is HR-coated for both wavelengths. The free-form mirror element 200 is HR-coated for the pump wavelength and has the desired outcoupling reflectivity for the solid state laser wavelength. The mirror element 200 can also have different coatings in the two regions 210 and 220. The back side 230 is AR-coated for the solid state laser wavelength. This back side 230 can be plane or can also be curved to collimate or shape the solid state laser beam passing through the mirror element 200. The second end face 320 of the solid state laser rod 300 forms the second end mirror of the solid state laser resonator. Due to the optical transparency of the body of the mirror element in the embodiment of FIG. 3, the two mirrors 210 and 220 can also be realized on opposing sides of the mirror element 200.

Figure 4:
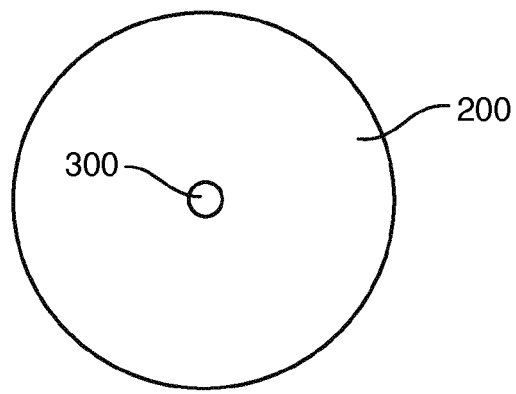
FIG. 4 a cross sectional view of an example of the proposed solid state laser device having a rod shaped solid state laser medium.
Figure 5:
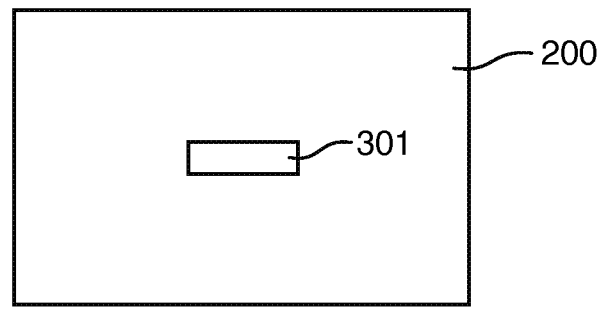
FIG. 5 a cross sectional view of an example of the proposed solid state laser device having a slab shaped solid state laser medium.
Figure 6:
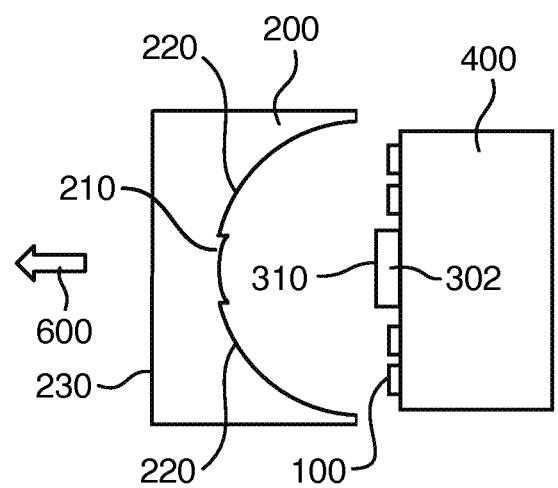
FIG. 6 a schematic view of a further example of the proposed solid state laser device having a disc shaped solid state laser medium.

The active medium of the solid state laser can for example be shaped as a rod 300, a slab 301, a disc 302 or be formed of a fiber of a fiber laser. FIGS. 4 to 6 illustrate some of the different geometries. FIG. 4 shows a cross section of an example of the proposed solid state laser in case of a laser rod 300 as the active solid state laser medium. FIG. 5 shows a cross section of an example of the solid state laser having a slab 301 as the solid state laser medium. Especially in the case of such a slab laser, the free-form optic (mirror element 200) can be non-rotational symmetric and shape the pump beam and/or the laser mode matching the geometry of the active material as exemplary indicated in FIG. 5.

FIG. 6 schematically shows an example of a solid state laser having a disc 302 as the active laser medium. In this case, the disc 302 is mounted on one side of the heat sink 400. On the same side, the pump lasers 100 are arranged on the heat sink 400 surrounding the solid state laser disc 302. The end mirrors of the laser resonator are formed in the same manner as for example in FIG. 2. In case of such a disc laser as shown in FIG. 6, the active material can also be an optically pumped semiconductor disc chip (OP-SDL or OP-VECSEL).

Figure 7:
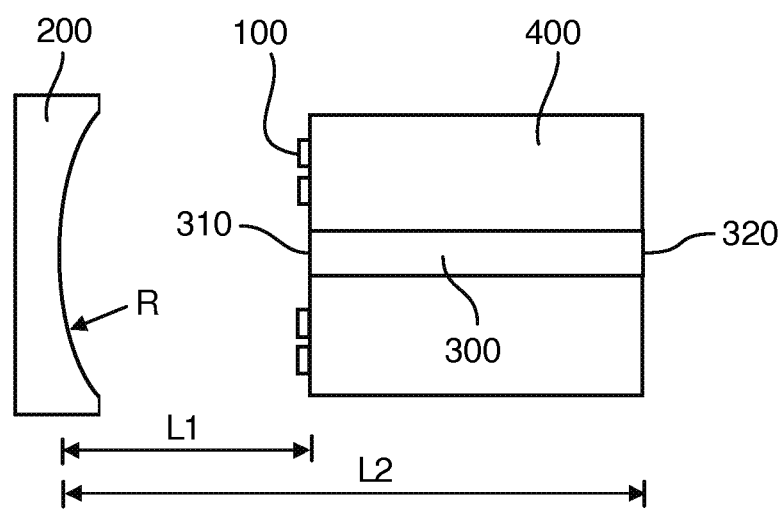
FIG. 7 a cross sectional view of a further example of the proposed solid state laser device.

In another embodiment of the invention as shown in FIG. 7, the mirror element 200 is realized as a single spherical or parabolic mirror. The radius of curvature R of the mirror element 200 is chosen to be two times (±10%) the distance L1 between the central portion of the mirror element 200 and the end facet 310 of the laser medium 300, focusing the pump light into the laser medium 300. At the same time, the total length L2 of the laser resonator formed by the central portion of the mirror element 200 and the other end facet 320 of the laser medium 300 is smaller or equal the radius of curvature of the mirror element 200 to form a stable laser resonator such that the spot of the pump light on the laser medium is self-aligned with the optical axis of the laser resonator.

The following figures show embodiments of the mirror element of the proposed solid state laser device in which a lens is formed in the central region of the front side of the body of the mirror element 200 and the resonator mirror is formed at the back side.

Figure 8:
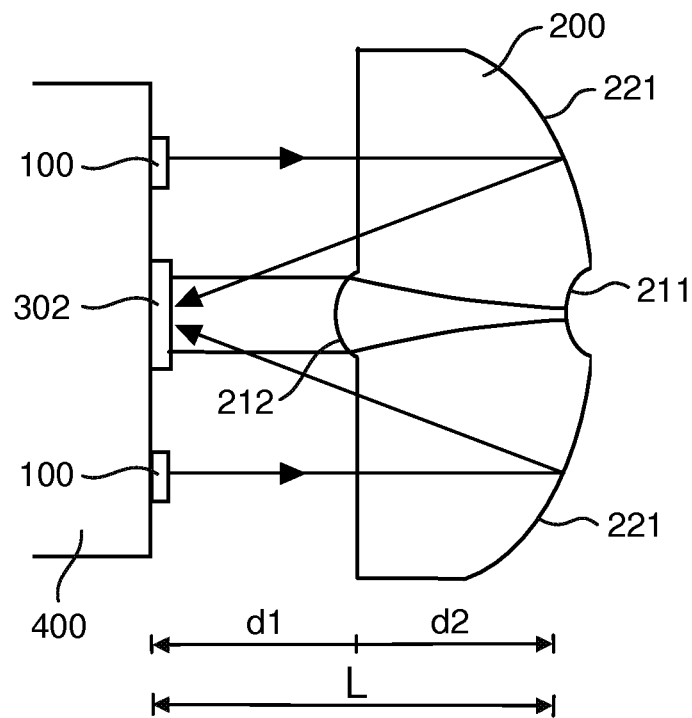
FIG. 8 a cross sectional view of an example of the mirror element of the proposed solid state laser device.

FIG. 8 shows a disc 302 forming the active medium which is attached to a heat sink 400 and surrounded by at least one pump laser diode 100. The body of the mirror element 200 comprises two optical surfaces, a front surface facing the disc 302 and a back surface. A mirror 221 reflecting the pump radiation into the active medium 302 is arranged in the outer region of the back surface. The back surface is fully coated with a high reflection coating, which has a reflectivity at the laser wavelength enabling lasing operation (typically R=90%–99.5%) and a reflectivity at the pump wavelength>90%, preferably >99%. The front surface is AR-coated for both wavelengths.

The inner or central region of the back surface forms the outcoupling mirror 211 of the laser resonator with the radius of curvature R. The inner or central region of the front surface forms a lens 212 with the focal length f. The side of the laser disc 302 facing away from the mirror element 200 forms the other end mirror of the resonator which includes this resonator mirror, the laser disc 302, the lens 212 and the outcoupling mirror 211. The distance $d_1$ between the laser disc 302 and the lens 212 and the distance $d_2$ between the lens 212 and the outcoupling mirror 211, as well as the focal length f of the lens 212 and the radius of curvature R of the outcoupling mirror 211 are chosen to form a stable resonator, with a large mode size in the active element, i.e. laser disc 302. Preferably, lens 212 is of convex shape, focusing the laser light on the outcoupling mirror 211, which can be convex or plane or preferably concave. The combination of a convex lens with a concave mirror allows the largest mode size in the active medium for a given total length $L=d_1+d_2$ of the full resonator. For the same total length L, the mode size can be a factor of 2 to 3 larger compared to the confocal design without such a lens, which is a factor of 4 to 9 in the optical power inside the fundamental optical mode.

Figure 9:
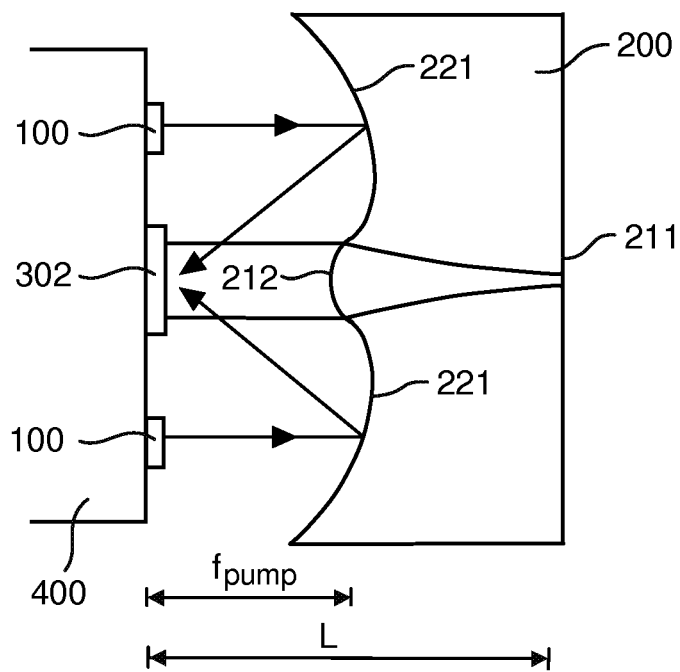
FIG. 9 a cross sectional view of a further example of the mirror element of the proposed solid state laser device.

In a further embodiment shown in FIG. 9, the two optical surfaces of the body of the mirror element 200 can have spatially localized coatings, giving more design freedom. In this case, the pump reflector 221 can be realized on the front surface (HR coated for pump radiation) together with an AR-coated lens 212 in the center of this surface. The HR-coated end mirror 211 is realized on the back surface and can be formed plane, concave or convex. With this design the cavity length L of the laser resonator is decoupled from the position $f_{pump}$ of the pump reflector 221, enabling a short focal length of the pump reflector to achieve a small pump spot and a long resonator to achieve large mode volumes at the same time.

This decoupling of L and $f_{pump}$ can also be achieved by a different material thickness of the body of the optical element, but with standard production methods the maximum difference between both thicknesses is usually limited.

Figure 10:
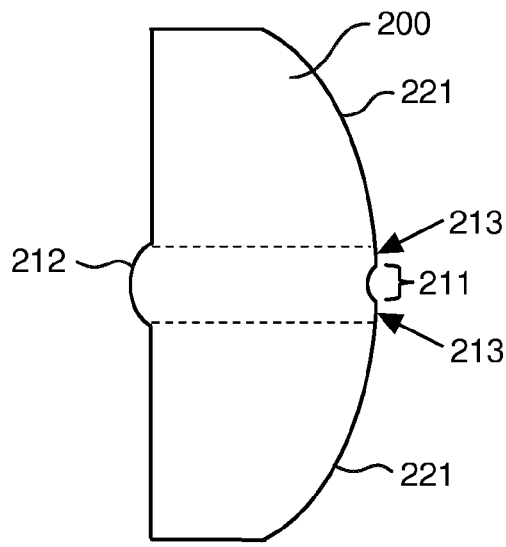
FIG. 10 a cross sectional view of a further example of the mirror element of the proposed solid state laser device.

In a further embodiment of the proposed solid state laser, the central region of the mirror element 200 forms an instable resonator consisting of an AR-coated lens 212 at the front surface, a HR-coated end mirror 211 in the inner center of the back surface and an outcoupling area 213 which surrounds the end mirror 211 and is preferably AR-coated. Such an embodiment is shown in FIG. 10. The outcoupling area 213 can additionally be shaped to a lens or a free-form optic to further shape the outcoupled beam.

Figure 11:
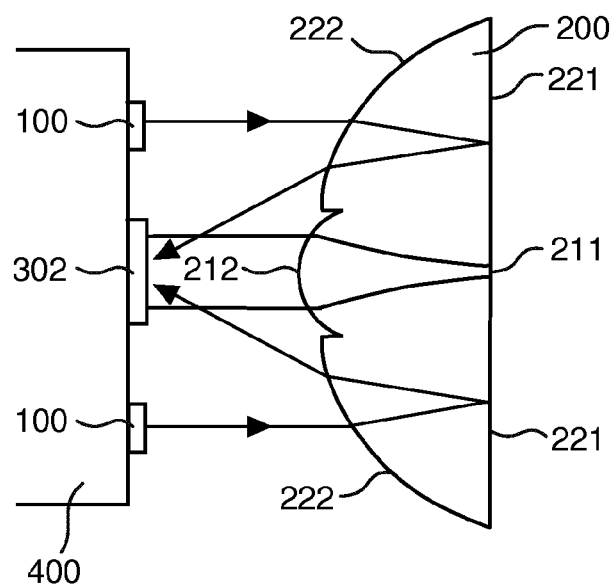
FIG. 11 a cross sectional view of a further example of the mirror element of the proposed solid state laser device.

FIG. 11 shows an embodiment in which the pump reflector 221 is arranged on the back surface of the mirror element 200 and the outer region 222 of the front surface is formed to direct the pump radiation in combination with the pump reflector 221 towards the active medium. With an appropriate shape of this outer region 222 of the front surface, a parabolic pump reflector as shown in FIG. 1 can be replaced by such a curved, AR-coated front region 222 and a HR-coated back surface (reflector 221), which can be plane or also curved.

Figure 12:
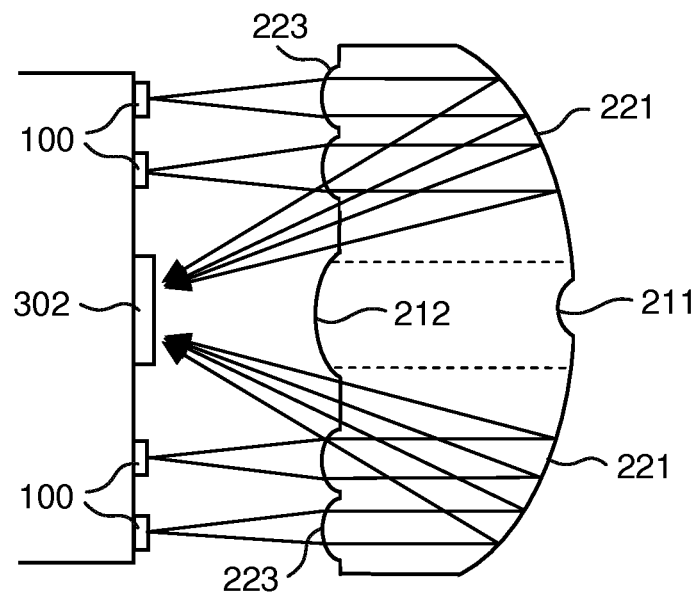
FIG. 12 a cross sectional view of a further example of the mirror element of the proposed solid state laser device.

In addition, the outer region of the front surface may be shaped to form a lens array 223 as shown in FIG. 12. The lens array 223 is designed and arranged to collimate the beams of the pump diodes 100, while the outer region of the back surface acts as a (parabolic) pump mirror 221. Compared to previous embodiments, this allows a longer cavity length L for a constant pump spot and thus a larger mode area. In addition, the thermal load per heat sink area is lower.

Figure 13:
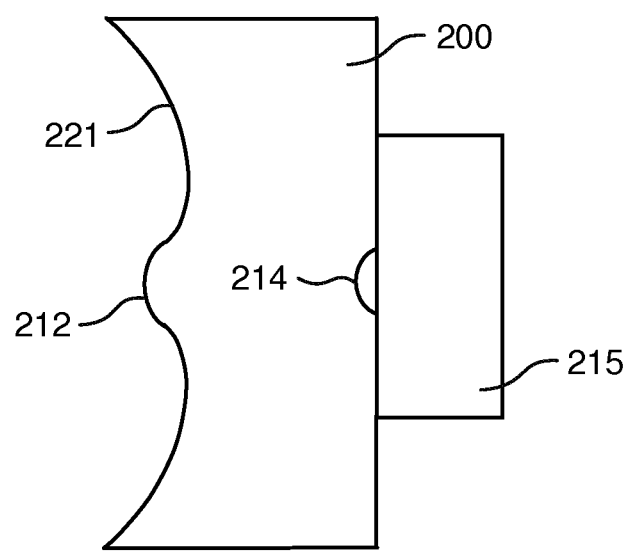
FIG. 13 a cross sectional view of a further example of the mirror element of the proposed solid state laser device

In a further embodiment shown in FIG. 13, the outcoupling mirror 211 of the previous figures is be replaced by a second lens, enabling the formation of a resonator with a telescope consisting of first lens 212 and second lens 214 to increase the mode size in the active medium. In this embodiment a separate plane or curved outcoupling mirror 215 has to be attached to the back surface.

While the invention has been illustrated and described in detail in the drawings and foregoing description, such illustration and description are to be considered illustrative or exemplary and not restrictive; the invention is not limited to the disclosed embodiments. For example, although the figures show the direct fitting of the front portion of the mirror element 200 to the heat sink 400, it is also possible to arrange this mirror element separate from the heat sink. Furthermore, functional laser elements for the solid state laser like etalons, non-linear crystals, SESAMs (Semiconductor Saturable Absorber Mirrors), Saturable Absorbers, Polarizers, Pockels-cells, AOMs (acousto-optical modulators) . . . can be integrated on or in the vicinity of the front or back surfaces 210, 230 of the central portion of the mirror element 200 or on or in the vicinity of the surfaces 310,320 of the solid state laser material. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. In particular, all claims of the device can be freely combined. Any reference signs in the claims should not be construed as limiting the scope.

LIST OF REFERENCE SIGNS 100 pump laser diodes
200 mirror element
210 central region of mirror element/resonator mirror
211 outcoupling mirror
212 lens
213 outcoupling area
214 second lens
215 outcoupling mirror
220 outer region of mirror element
221 pump reflector
222 outer region of front surface
223 lens array
230 back side of mirror element
300 laser rod
301 slab
302 disc
310 first end face of laser rod
320 second end face of laser rod
400 heat sink
500 second resonator mirror
600 laser emission

The invention claimed is:

1. An optically pumped solid state laser device comprising:
a solid state laser medium in a laser resonator and one or several pump laser diodes, said pump laser diodes being arranged to optically pump said solid state laser medium by reflection of pump radiation at a mirror element,
wherein said mirror element is arranged on an optical axis of said laser resonator and is designed to reflect said pump radiation to the solid state laser medium and to form at the same time a first resonator mirror of the laser resonator, thereby providing a fixed spatial arrangement between the pump radiation and optical axis of the laser resonator,
wherein said mirror element comprises a body of a material optically transparent for laser radiation, said first resonator mirror being formed in a central region of a back surface of the body,
wherein a lens is formed in a central region of a front surface of the body facing the solid state laser medium, said first resonator mirror and said lens being arranged and designed to form a resonator with a second resonator mirror on an opposite side of the solid state laser medium.

2. The device according to claim 1, wherein said mirror element comprises a central region which forms said first resonator mirror and an outer region which is designed to reflect said pump radiation to the solid state laser medium.

3. The device according to claim 2, wherein said central region and said outer region are formed with different curvatures.

4. The device according to claim 1, wherein said first resonator mirror and said lens are arranged to increase a mode size of the laser radiation in the solid state laser medium compared to a resonator of equal length without said lens.

5. The device according to claim 1, wherein an outer region of the back surface of the body is designed to reflect said pump radiation to the solid state laser medium.

6. The device according to claim 1, wherein a lens array is formed at the front surface of the body, said lens array being arranged and designed to collimate laser beams of the pump laser diodes propagating towards the back surface of the body.

7. The device according to claim 1, wherein an outer region of the front surface of the body is designed to reflect said pump radiation to the solid state laser medium.

8. The device according to claim 2, wherein said pump laser diodes are arranged to emit said pump radiation substantially parallel to the optical axis of the laser resonator towards said mirror element.

9. The device according to claim 2, wherein said solid state laser medium is mounted in a cooling device or is attached to a cooling device and said pump laser diodes are arranged on a side face of said cooling device being perpendicular to the optical axis of the laser resonator.

10. The device according to claim 7, wherein said pump laser diodes are arranged to surround an end face of the solid state laser medium at which the pump radiation enters the solid state laser medium.

11. The device according to claim 8, wherein a body of said mirror element is shaped to mechanically fit with an outer front portion to an outer shape of the cooling device.

12. The device according to claim 2, wherein said central region of said mirror element is designed to generate a laser mode which does not have a Gaussian intensity profile in the solid state laser medium.

\* \* \* \* \*